(12) United States Patent
Iwabuchi et al.

(10) Patent No.: US 8,169,520 B2
(45) Date of Patent: *May 1, 2012

(54) SOLID-STATE IMAGING APPARATUS AND CAMERA

(75) Inventors: Shin Iwabuchi, Kanagawa (JP); Nobuhiro Karasawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/611,494

(22) Filed: Nov. 3, 2009

(65) Prior Publication Data
US 2010/0045833 A1 Feb. 25, 2010

Related U.S. Application Data

(62) Division of application No. 11/550,492, filed on Oct. 18, 2006, now Pat. No. 7,812,874.

(30) Foreign Application Priority Data

Oct. 21, 2005 (JP) ................................. 2005-307636

(51) Int. Cl.
*H04N 3/14* (2006.01)
*H01L 31/00* (2006.01)
(52) U.S. Cl. .......................................... 348/294; 257/22
(58) Field of Classification Search .............. 348/294, 348/302, 315; 257/223, 215, 22, 292, 445, 257/250
See application file for complete search history.

(56) References Cited

U.S. PATENT DOCUMENTS

| | | | |
|---|---|---|---|
| 5,442,396 A | | 8/1995 | Nakashiba |
| 6,657,665 B1 * | | 12/2003 | Guidash ........................ 348/308 |
| 6,734,906 B1 * | | 5/2004 | Hashimoto .................... 348/302 |
| 7,141,841 B2 * | | 11/2006 | Mouli ........................... 257/291 |
| 7,215,886 B2 * | | 5/2007 | Maruyama et al. ........... 398/117 |
| 2002/0044215 A1 | | 4/2002 | Takagi et al. |
| 2003/0214595 A1 * | | 11/2003 | Mabuchi ........................ 348/294 |
| 2004/0113151 A1 * | | 6/2004 | Sekine ............................ 257/72 |
| 2004/0218076 A1 * | | 11/2004 | Lee ................................ 348/294 |
| 2005/0001905 A1 * | | 1/2005 | Shinomiya ............... 348/207.99 |
| 2006/0006488 A1 * | | 1/2006 | Kanbe ........................... 257/443 |
| 2007/0040922 A1 | | 2/2007 | McKee et al. |

FOREIGN PATENT DOCUMENTS

| | | |
|---|---|---|
| JP | 11-312800 | 11/1999 |
| JP | 2003-031785 | 1/2003 |
| JP | 2004-015298 | 1/2004 |
| JP | 2005-150492 | 6/2005 |

OTHER PUBLICATIONS

Japanese Office Action issued on Nov. 30, 2010 in connection with counterpart JP Application No. 2005-307636.

* cited by examiner

*Primary Examiner* — Lin Ye
*Assistant Examiner* — Euel Cowan
(74) *Attorney, Agent, or Firm* — SNR Denton US LLP

(57) ABSTRACT

A solid-state imaging apparatus including a plurality of sensors that are formed on a substrate on a pixel basis and photoelectrically convert the light incident from a first surface side of the substrate, and a readout circuit that is formed on a second surface side of the substrate, which is the opposite side to the first surface side, and processes a signal from the plurality of sensors. The readout circuit includes a plurality of transistors and the transistors are disposed in a region between the pixels in an aligned manner.

15 Claims, 11 Drawing Sheets

SOLID-STATE IMAGING APPARATUS AND CAMERA

RELATED APPLICATION DATA

This application is a division of U.S. patent application Ser. No. 11/550,492, filed Oct. 18, 2006, the entirety of which is incorporated herein by reference to the extent permitted by law. The present invention claims priority to Japanese Patent Application No. JP 2005-307636 filed in the Japanese Patent Office on Oct. 21, 2005, the entirety of which also is incorporated by reference herein to the extent permitted by law.

BACKGROUND OF THE INVENTION

The present invention relates to a solid-state imaging apparatus and a camera, and particularly to a back-illuminated solid-state imaging apparatus and a camera with the solid-state imaging apparatus.

As a solid-state imaging apparatus, an image sensor using a MOS (Metal Oxide Semiconductor) transistor (hereinafter referred to as a MOS-type solid-state imaging apparatus), which is a standard technology in IC manufacturing, has become widely used. The MOS-type solid-state imaging apparatus has an advantage in that it may not require a high drive voltage unlike a CCD (Charge Coupled Device) and it can be compact through integration with peripheral circuits.

The MOS-type solid-state imaging apparatus usually includes a readout circuit, such as an amplifier transistor, corresponding to each sensor (photodiode) that receives light and converts it into charges. In the MOS-type solid-state imaging apparatus, the readout circuit and wiring are disposed on the light incident side. The solid-state imaging apparatus with the readout circuit and wiring disposed on the light incident side is referred to as a front-illuminated solid-state imaging apparatus.

There is known a MOS-type solid-state imaging apparatus having a so-called multi-pixel sharing structure, that is, configured such that a plurality of sensors share a readout circuit in order to further reduce the space for the readout circuit and increase the sensor area in a pixel. For example, there have been proposed a solid-state imaging apparatus having a two-pixel sharing structure in which one readout circuit is provided for every two pixels (see JP-A-2005-150492), and a solid-state imaging apparatus having a four-pixel sharing structure in which one readout circuit is provided for every four pixels (see JP-A-2004-15298).

On the other hand, there has been proposed a back-illuminated solid-state imaging apparatus in which a readout circuit and wiring are disposed on the opposite side to the light incident side, as a technology for avoiding light-blocking wiring and increasing the sensor area (see JP-A-2003-31785).

SUMMARY OF THE INVENTION

However, in the front-illuminated solid-state imaging apparatus having a multi-pixel sharing structure, transistors forming the readout circuit may not be placed together because of layout constraints, but need to be placed apart from each other. This undesirably creates an extra space around a pixel.

Partially expanding the area of the photodiode to effectively use this extra space causes the shape of each photodiode to be non-uniform, resulting in pixel-to-pixel sensitivity variations.

On the other hand, the back-illuminated type has fewer layout constraints, so that the advantage of the multi-pixel sharing structure can be conceivably utilized to the maximum.

However, the fact is that there have been made few proposals to date for optimizing the layout of a back-illuminated solid-state imaging apparatus having a multi-pixel sharing structure.

The invention has been made in view of the above circumstances and it is desirable to provide a back-illuminated solid-state imaging apparatus having a multi-pixel sharing structure whose layout can maximize the sensor area in a pixel.

According to an embodiment of the invention, there is provided a solid-state imaging apparatus including a plurality of sensors that are formed on a substrate on a pixel basis and photoelectrically convert the light incident from a first surface side of the substrate, and a readout circuit that is formed on a second surface side of the substrate, which is the opposite side to the first surface side, and processes a signal from the plurality of sensors. The readout circuit includes a plurality of transistors and the transistors are disposed in a region between the pixels in an aligned manner.

According to another embodiment of the invention, there is provided a solid-state imaging apparatus including a plurality of sensors that are formed on a substrate on a pixel basis and photoelectrically convert the light incident from a first surface side of the substrate, a floating diffusion to which a signal from the plurality of sensors is transferred, a transfer gate that is formed on a second surface side of the substrate, which is the opposite side to the first surface side, and disposed between the floating diffusion and the sensor, and a readout circuit that is formed on the second surface side of the substrate and disposed corresponding to one or more of the floating diffusions. The readout circuit includes a reset transistor and an amplifier transistor and the transistors are disposed in a region between the pixels in an aligned manner.

According to another embodiment of the invention, there is provided a solid-state imaging apparatus including a plurality of sensors that are formed on a substrate on a pixel basis and photoelectrically convert the light incident from a first surface side of the substrate, a floating diffusion to which a signal from the plurality of sensors is transferred, a transfer gate that is formed on a second surface side of the substrate, which is the opposite side to the first surface side, and disposed between the floating diffusion and the sensor, and a readout circuit that is formed on the second surface side of the substrate and disposed corresponding to one or more of the floating diffusions. The readout circuit includes a reset transistor, an amplifier transistor and a selection transistor and the transistors are disposed in a region between the pixels in an aligned manner.

According to another embodiment of the invention, there is provided a camera including a solid-state imaging apparatus, an optical system that directs incident light to an assembly of pixels of the solid-state imaging apparatus, and a signal processing circuit that processes an output signal from the solid-state imaging apparatus. The solid-state imaging apparatus includes a plurality of sensors that are formed on a substrate on a pixel basis and photoelectrically convert the light incident from a first surface side of the substrate, and a readout circuit that is formed on a second surface side of the substrate, which is the opposite side to the first surface side, and processes a signal from the plurality of sensors. The readout circuit includes a plurality of transistors and the transistors are disposed in a region between the pixels in an aligned manner.

In the invention, the number of readout circuits is reduced by employing the multi-pixel sharing structure, and the extra space other than the sensor is reduced by aligning the transistors forming the readout circuit in the region between the pixels. As a result, the area of the sensor in a pixel can be maximized.

The back-illuminated solid-state imaging apparatus having a multi-pixel sharing structure according to an embodiment of the invention can maximize the area of the sensor.

DESCRIPTION OF THE PREFERRED EMBODIMENTS

Embodiments of the invention will be described below with reference to the drawings.

First Embodiment

Figure 1:
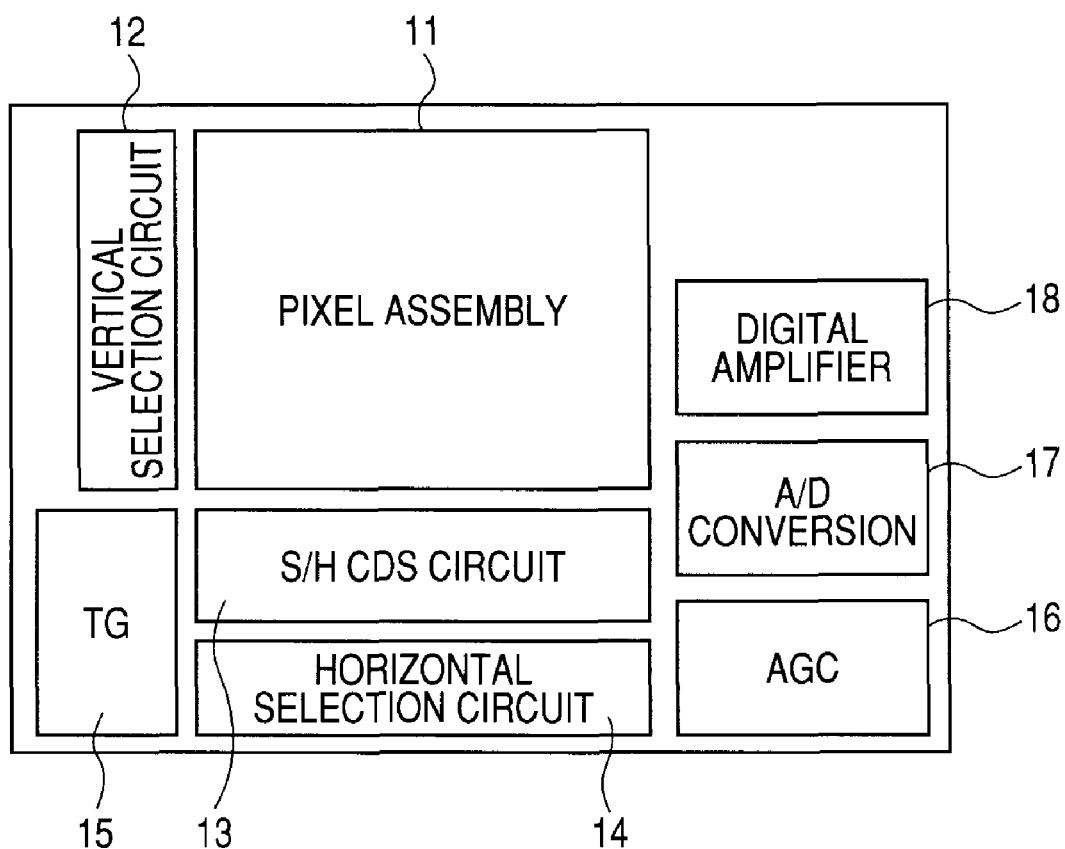
FIG. 1 is a schematic block diagram of the solid-state imaging apparatus according to the first to third embodiments.

FIG. 1 shows a schematic block diagram of the solid-state imaging apparatus according to this embodiment.

The solid-state imaging apparatus includes an assembly of pixels 11 and peripheral circuits, which are mounted on a same semiconductor substrate. In this embodiment, the peripheral circuits include a vertical selection circuit 12, an S/H (Sample and Hold) CDS (Correlated Double Sampling) circuit 13, an horizontal selection circuit 14, a timing generator (TG) 15, an AGC (Automatic Gain Control) circuit 16, an A/D conversion circuit 17 and a digital amplifier 18.

The assembly of pixels 11 has a numerous unit pixels, which will be described later, arranged in a matrix, address lines (pixel selection lines) and the like on a row basis and signal lines and the like on a column basis.

The vertical selection circuit 12 sequentially selects pixels on a row basis and reads out a signal from each of the pixels on a pixel row basis to the S/H CDS circuit 13 via the signal line. The S/H CDS circuit 13 provides signal processing, such as CDS, on the pixel signal read out from each pixel row.

The horizontal selection circuit 14 sequentially retrieves the pixel signals held in the S/H CDS circuit 13 and outputs them to the AGC circuit 16. The AGC circuit 16 amplifies the signal inputted from the horizontal selection circuit 14 at an appropriate gain and outputs it to the A/D conversion circuit 17.

The A/D conversion circuit 17 converts the analog signal inputted from the AGC circuit 16 into a digital signal and outputs it to the digital amplifier 18. The digital amplifier 18 appropriately amplifies the digital signal inputted from the A/D conversion circuit 17 and outputs it from a pad (terminal), which will be described later.

The operations of the vertical selection circuit 12, the S/H CDS circuit 13, the horizontal selection circuit 14, the AGC circuit 16, the A/D conversion circuit 17 and the digital amplifier 18 are performed based on various timing signals outputted from the timing generator (TG) 15.

Figure 2:
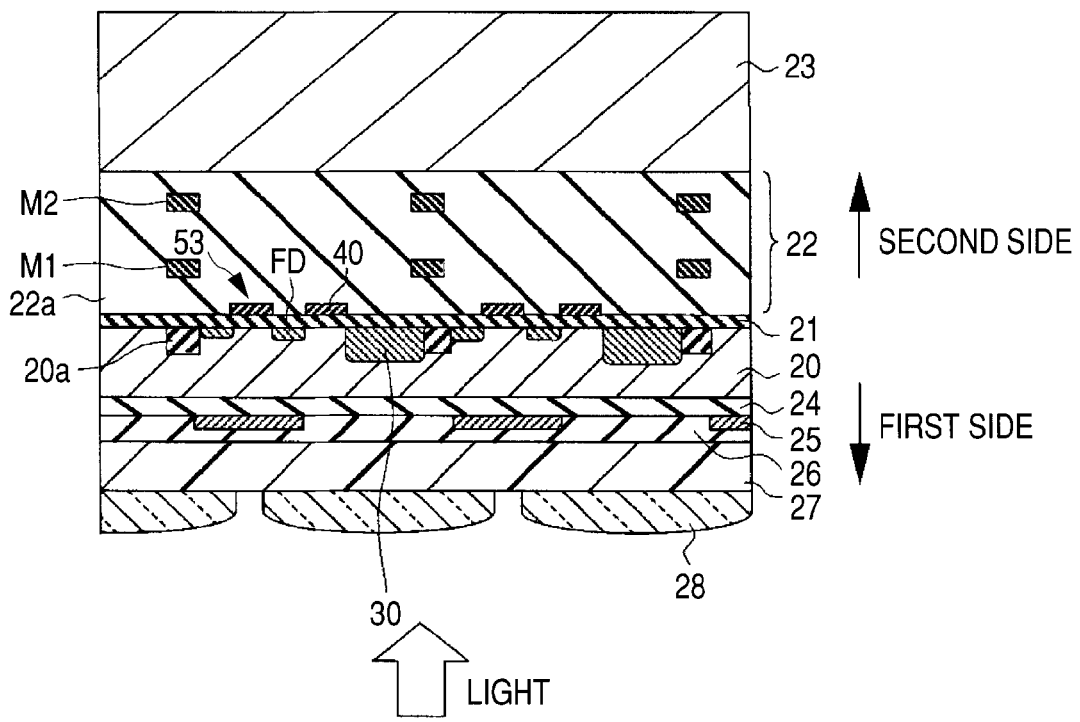
FIG. 2 is a schematic cross-sectional view of the assembly of pixels of the solid-state imaging apparatus according to the first to third embodiments.

FIG. 2 is a schematic cross-sectional view of the assembly of pixels of the solid-state imaging apparatus.

A substrate 20 is made of, for example, p-type silicon. An element separation insulator 20a made of, for example, silicon oxide is formed in the portion of the substrate 20 other than an active region. A plurality of photodiodes 30 (sensors), each forming a unit pixel, are formed in the active regions of the substrate 20. An n-type region is formed in the region of the photodiode 30. More specifically, the photodiode 30 is formed of a pn junction between the n-type region and the surrounding p-type region. The thickness of the substrate 20 is thin enough to allow light to enter from the back side (first surface side). The thickness of the substrate 20, which depends on the type of the solid-state imaging apparatus, is 2 to 6 μm for visible light, while it is 6 to 10 μm for infrared light.

A floating diffusion FD and sources or drains of various transistors that form the readout circuit are formed in the active region of the substrate 20. A transfer gate 40 and gates of various transistors that form the readout circuit are formed on the second surface side of the substrate 20 via a gate insulating film 21 made of silicon oxide. These gates are made of, for example, polysilicon. Among the transistors forming the readout circuit, only a reset transistor 53 are illustrated in FIG. 2.

A wiring layer 22 is formed above the transfer gate 40 and the other transistors. The wiring layer 22 includes an interlayer insulating film 22a made of, for example, silicon oxide, a first metal wiring line M1 and a second metal wiring line M2 embedded in the interlayer insulating film 22a. The metal wiring line M1 and M2 are made of aluminum or copper. In this embodiment, although an example of two-layer metal wiring will be described, the metal wiring may be formed of three or more layers.

A support substrate 23 is provided on the wiring layer 22 via an adhesive layer (not shown). The support substrate 23 is provided to reinforce the strength of the substrate 20. The support substrate 23 is formed of, for example, a silicon substrate.

A silicon oxide film 24 is formed on the first side of the substrate 20, and a light blocking film 25 that has apertures corresponding to photodiodes 30 is formed on the silicon oxide film 24. The light blocking film 25 is formed of, for example, an aluminum film. When the substrate 20 sufficiently absorbs incident light, no light blocking film may be provided in the assembly of pixels.

A silicon nitride film 26 is formed on the silicon oxide film 24 and the light blocking film 25. A color filter 27 that only transmits light having a range of predetermined wavelengths is formed on the silicon nitride film 26. An on-chip lens 28 that focuses the incident light onto the photodiode 30 is formed on the color filter 27.

Figure 3:
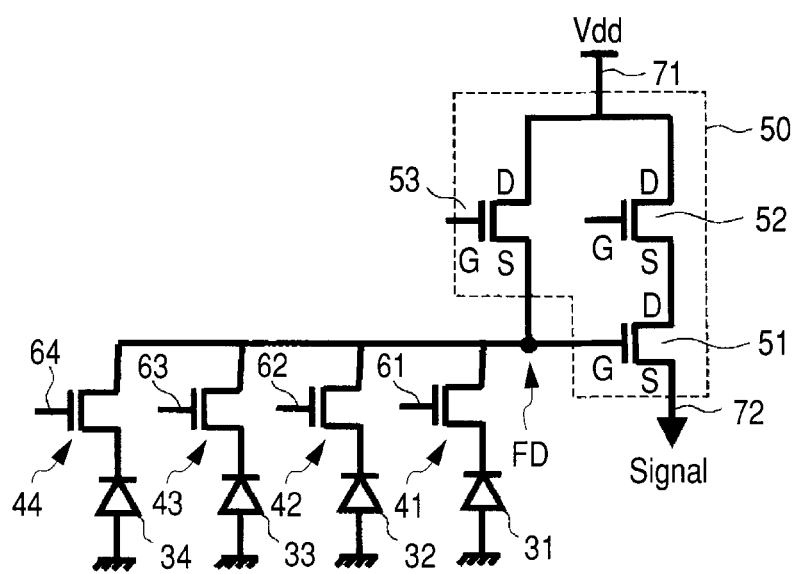
FIG. 3 is a circuit diagram of the assembly of pixels of the solid-state imaging apparatus according to the first and second embodiments.

FIG. 3 shows one example of the circuit configuration of the assembly of pixels 11. FIG. 3 is a circuit diagram of a four-pixel sharing structure in which four pixels share one readout circuit 50.

In this embodiment, one readout circuit 50 is provided for four photodiodes 31 to 34. That is, one readout circuit 50 reads out signals from the four photodiodes 31 to 34 to the signal line 72. The readout circuit 50 includes an amplifier transistor 51, a selection transistor 52 and a reset transistor 53.

The photodiodes 31 to 34 photoelectrically convert the incident light into charges (electrons, in this embodiment) according to the amount of the incident light. Transfer gates 41 to 44 are provided between the photodiodes 31 to 34 and the floating diffusion FD, respectively.

More specifically, as described later, the floating diffusion FD includes a floating diffusion FD1 shared by the photodiodes 31, 32 and a floating diffusion FD2 shared by the photodiodes 33, 34. As the floating diffusion FD1 and floating diffusion FD2 are connected, they are illustrated simply as the floating diffusion FD in the circuit diagram of FIG. 3.

Pixel selection lines 61 to 64 are connected to the transfer gates 41 to 44, respectively. For example, when a selection signal is applied to the transfer gate 41 through the pixel selection line 61, electrons photoelectrically converted in the photodiode 31 are transferred to the floating diffusion FD. The pixel selection lines 62 to 64 work similarly.

The floating diffusion FD is connected to the gate (G) of the amplifier transistor 51. The amplifier transistor 51 and the selection transistor 52 are serially connected between the signal line 72 and a power supply line 71. That is, the source (S) of the amplifier transistor 51 is connected to the signal line 72. The drain (D) of the amplifier transistor 51 is connected to the source of the selection transistor 52. The drain of the selection transistor 52 is connected to the power supply line 71. The amplifier transistor 51 forms a source follower type amplifier.

When a selection signal is applied to the gate of the selection transistor 52 to turn on the selection transistor 52, the amplifier transistor 51 amplifies the potential on the floating diffusion FD and outputs a voltage according to the potential to the signal line 72. The voltage outputted from each pixel via the signal line 72 is outputted to the S/H CDS circuit 13.

The floating diffusion FD is connected to the source of the reset transistor 53. The drain of the reset transistor 53 is connected to the power supply line 71. When a reset signal is applied to the gate of the reset transistor 53, the potential on the floating diffusion FD is reset to the potential of a power supply Vdd.

Figure 4:
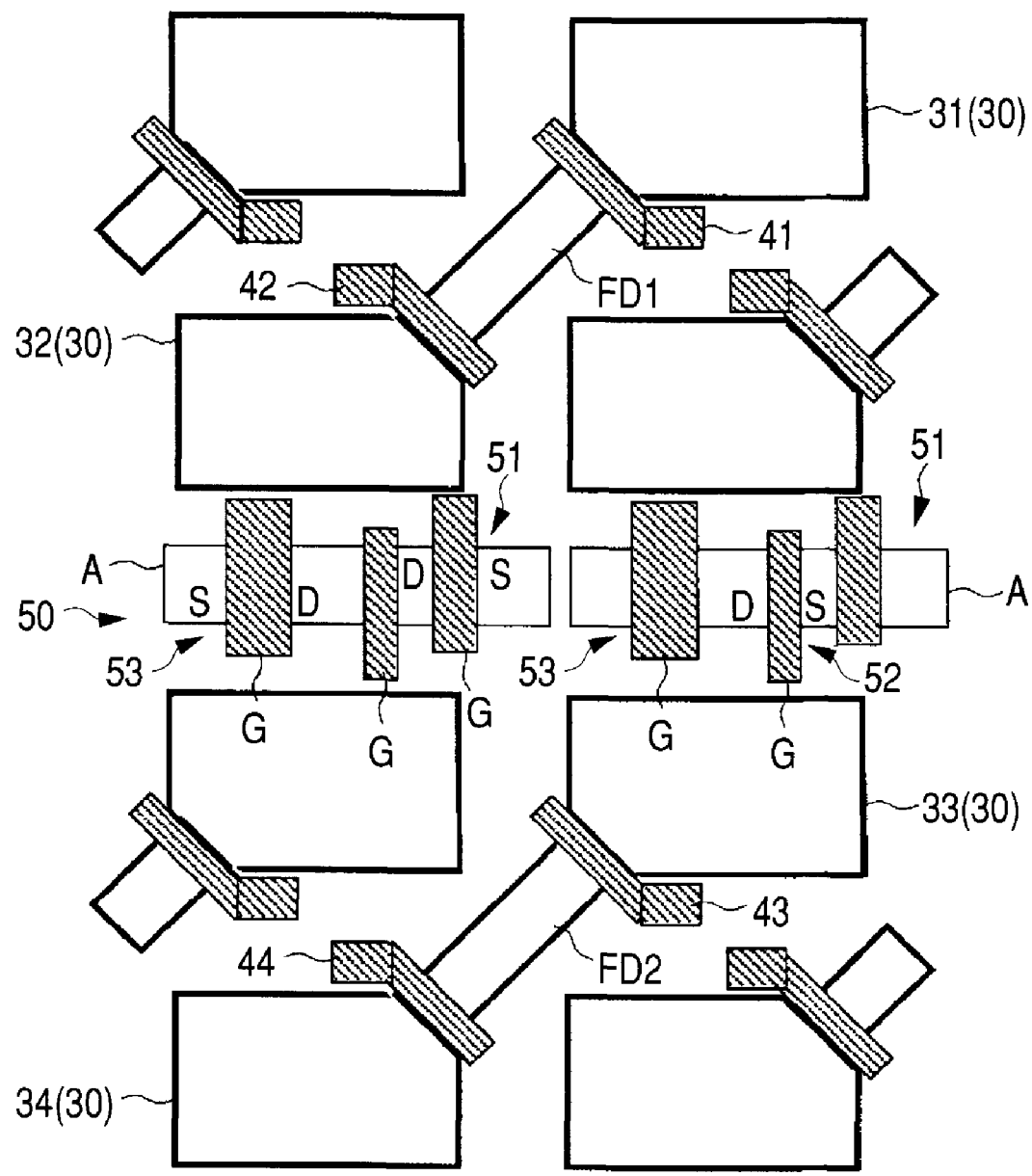
FIG. 4 shows a layout when a polysilicon electrode layer is provided in the assembly of pixels of the solid-state imaging apparatus according to the first embodiment.
Figure 5:
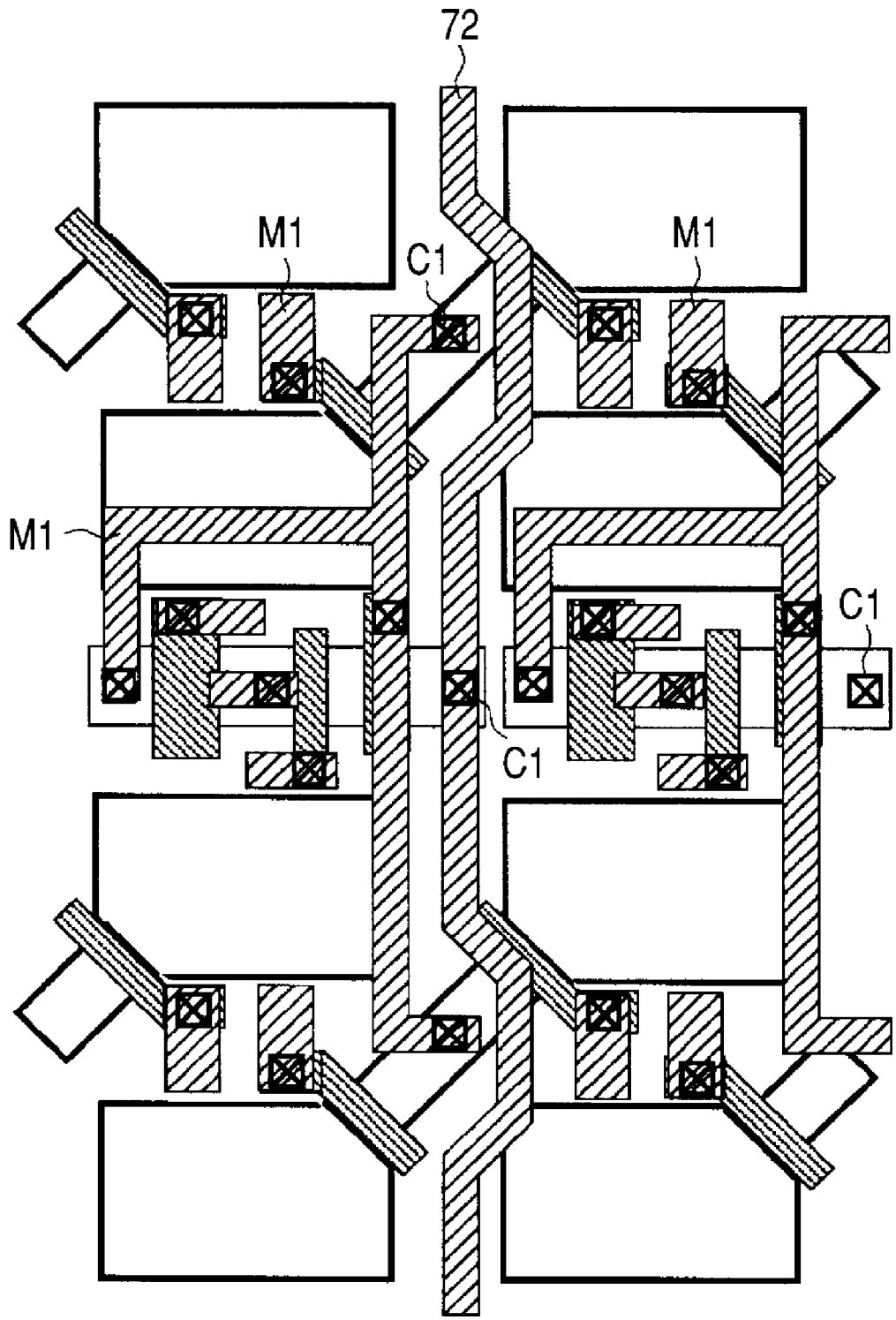
FIG. 5 shows a layout of a first metal wiring layer in the assembly of pixels of the solid-state imaging apparatus according to the first embodiment.
Figure 6:
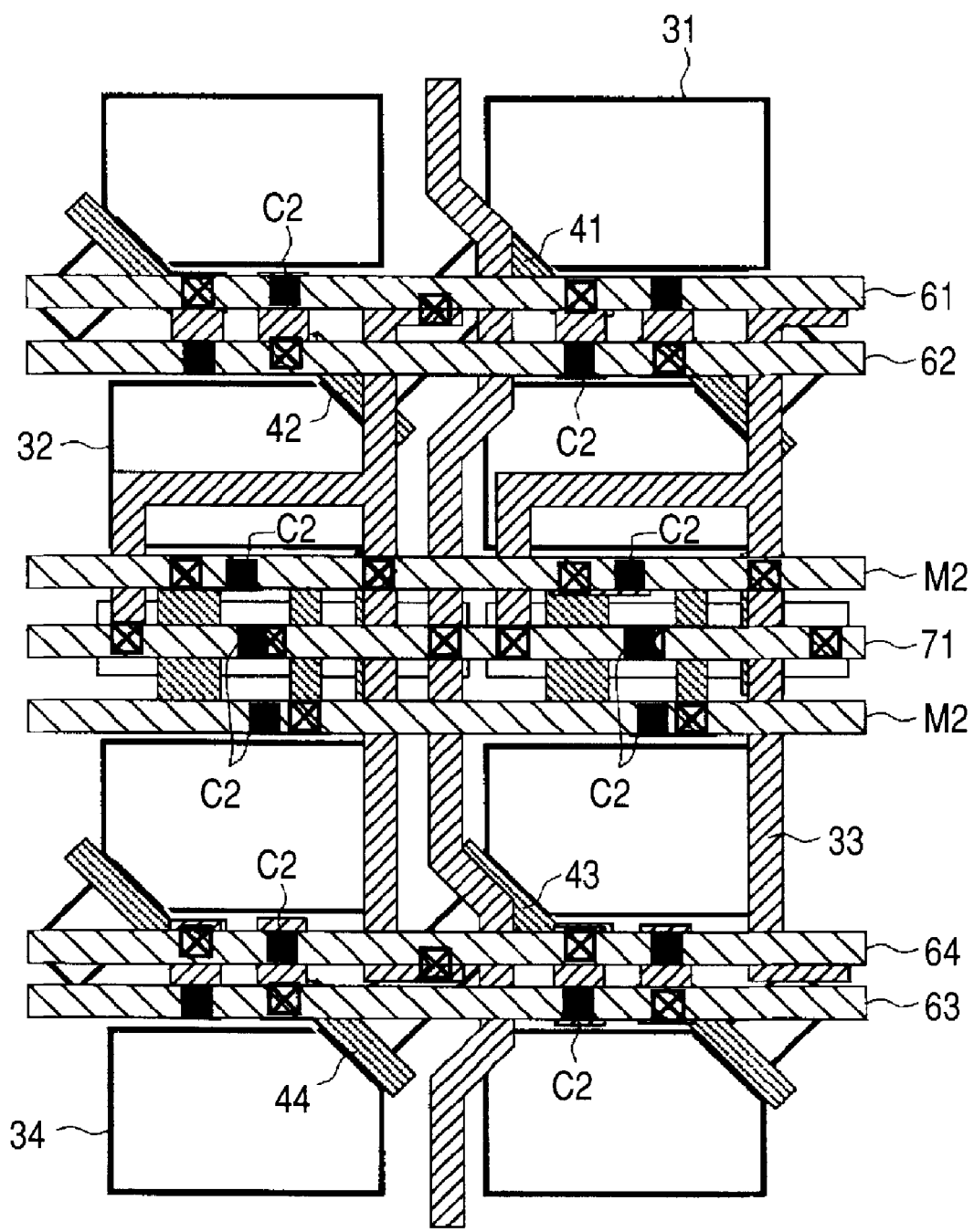
FIG. 6 shows a layout of a second metal wiring layer in the assembly of pixels of the solid-state imaging apparatus according to the first embodiment.

FIGS. 4 to 6 show layouts of the assembly of pixels of the solid-state imaging apparatus according to this embodiment. FIG. 6 shows the final layout. In this embodiment, the explanation is divided using three figures for better understanding. That is, FIG. 4 shows a layout when a polysilicon electrode (gate electrode) layer is provided. FIG. 5 shows a layout when a first metal wiring layer is provided. FIG. 6 shows the final layout including a second metal wiring layer.

Description will be first made with reference to FIG. 4. The photodiodes 30 are formed in a matrix. Among the plurality of photodiodes 30, four photodiodes 31, 32, 33 and 34 arranged in the vertical direction share one readout circuit 50. The four photodiodes 31 to 34 are not vertically aligned, but any two vertically adjacent photodiodes are disposed in different columns.

The floating diffusion FD1 is disposed between the photodiode 31 and the photodiode 32 that is diagonally disposed with respect to the photodiode 31. The transfer gate 41 is disposed between the floating diffusion FD1 and the photodiode 31. The transfer gate 42 is disposed between the floating diffusion FD1 and the photodiode 32. The transfer gate 41 and 42 are formed of polysilicon electrodes.

The floating diffusion FD2 is disposed between the photodiode 33 and the photodiode 34 that is diagonally disposed with respect to the photodiode 33. The transfer gate 43 is disposed between the floating diffusion FD2 and the photodiode 33. The transfer gate 44 is disposed between the floating diffusion FD2 and the photodiode 34. The transfer gate 43 and 44 are formed of polysilicon electrodes.

The readout circuit 50 is disposed in a space between two photodiodes, for example, in the space between the photodiodes in the second and third rows in the figure. In FIG. 4 where two columns of photodiodes are illustrated, there are two readout circuits 50.

The amplifier transistor 51, selection transistor 52 and reset transistor 53 that form the readout circuit 50 are disposed in an aligned manner. In this embodiment, the amplifier transistor 51, selection transistor 52 and reset transistor 53 share one active region A. The drain (D) of the reset transistor 53 and the drain (D) of the selection transistor 52 are integrated and shared by the both transistors, and the source of the selection transistor 52 and the drain of the amplifier transistor 51 are integrated and shared by the both transistors. The gates (G) of the amplifier transistor 51, selection transistor 52 and reset transistor 53 are formed of polysilicon electrodes.

First metal wiring lines M1 are disposed in the upper layer of the layout shown in FIG. 4 via first contacts C1 (see FIG. 5). The layout shown in FIG. 5 will now be described.

The signal line 72 is formed of the first metal wiring line M1. The signal line 72 extends in the column direction in a region between photodiodes 30. The signal line 72 serpentines such that it does not interfere with first contacts C1 that connect to the floating diffusions FD1 and FD2. The signal line 72 is connected to the source of the amplifier transistor 51 via the first contact C1.

The two floating diffusions FD1 and FD2, the source of the reset transistor 53 and the gate of the amplifier transistor 51 are connected to each other via first contacts C1 and the first metal wiring line M1. As the floating diffusion FD1 and the source of the reset transistor 53 are diagonally disposed with the photodiode 32 disposed therebetween, the first metal wiring line M1 that connects the floating diffusion FD1 and the source of the reset transistor 53 is disposed such that it overlaps with the photodiode 32. As the light enters from the opposite side to the wiring layer, the first metal wiring line M1 disposed in such a way that it overlaps with the photodiode will pose no problem.

First metal wiring lines M1 are formed on the transfer gates 41 to 44, on the gates of the selection transistor 52 and the reset transistor 53, and on the drain of the selection transistor 52 via first contacts C1. These first metal wiring lines M1 are formed in order to make contact with second metal wiring lines M2 in the further upper layer.

Second metal wiring lines M2 are disposed in the upper layer of the layout shown in FIG. 5 via second contacts C2 (see FIG. 6). The layout shown in FIG. 6 will now be described.

The power supply line 71 and pixel selection lines 61 to 64 are formed of second metal wiring lines M2. The power supply line 71 extends in the row direction (horizontal direction) between photodiodes on the readout circuit 50. The power supply line 71 is connected to the drain for the selection transistor 52 and the reset transistor 53 via the second contact C2.

The pixel selection lines 61 and 62 extend in the row direction in the space between the photodiodes 31 and 32. The pixel selection line 61 is connected to the transfer gate 41 via the second contact C2. The pixel selection line 62 is connected to the transfer gate 42 via the second contact C2.

The pixel selection lines 63 and 64 extend in the row direction in the space between the photodiodes 33 and 34. The pixel selection line 63 is connected to the transfer gate 43 via the second contact C2. The pixel selection line 64 is connected to the transfer gate 44 via the second contact C2.

Two second metal wiring lines M2, adjacent to the power supply line 71, extend in the row direction in a space between photodiodes. One of the second metal wiring lines M2 is connected to the gates of a plurality of reset transistors 53 adjacent to each other in the row direction via second contacts C2. The other second metal wiring line M2 is connected to the gates of a plurality of selection transistors 52 adjacent to each other in the row direction via second contacts C2.

Advantages of the back-illuminated solid-state imaging apparatus having a multi-pixel sharing structure according to this embodiment will now be described.

In this embodiment, the amplifier transistor 51, selection transistor 52 and reset transistor 53 that form the readout circuit 50 are disposed in the region between pixels, that is, between photodiodes in an aligned manner. The components of the readout circuit 50 are thus placed together, so that the extra space between photodiodes 30 can be reduced. Particularly in this embodiment, the amplifier transistor 51, selection transistor 52 and reset transistor 53 share the active region A, so that the area of the readout circuit 50 can be minimized.

Furthermore, when the floating diffusions FD1, FD2 and the drain of the reset transistor 53 are connected, the first metal wiring line M1 is disposed such that it overlaps with the photodiode 32, allowing a minimized wiring distance and hence reduced resistance. In the case of the back-illuminated type, the metal wiring line thus overlapping with the photodiode 30 will not prevent light from entering the photodiode 30.

As described above, in this embodiment, the number of readout circuits 50 can be reduced by employing the multi-pixel sharing structure, and the extra space other than the photodiode 30 can be minimized by aligning the transistors that form the readout circuit 50. As a result, the area of the photodiode 30 in a pixel can be maximized. These allow increased sensitivity and an increased saturation output of the pixel and a smaller pixel while optical characteristics are maintained.

When a photodiode 30 having the same area as that of the related art is used, the area of each pixel can be reduced, so that the whole area of the assembly of pixels can be reduced.

Furthermore, in this embodiment, the first metal wiring line M1 is provided such that it is not diverted around but overlaps with the photodiode 30, allowing a shorter distance for connection between the floating diffusions FD1, FD2 and the readout circuit 50. As a result, the wiring resistance can be reduced, so that the signal processing speed can be improved. Moreover, the linearly disposed pixel selection lines 61 to 64 can reduce signal degradation as compared to the case where they are disposed in a serpentine manner.

The solid-state imaging apparatus described above will be used, for example, in various cameras, such as a video camcorder, digital still camera and endoscope camera.

Figure 7:
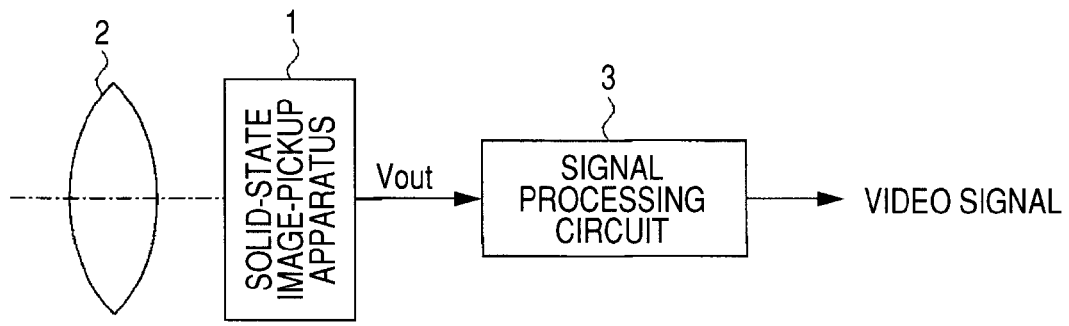
FIG. 7 is a schematic block diagram of a camera to which the solid-state imaging apparatus according to this embodiment is applied.

FIG. 7 is a schematic block diagram of a camera that uses the solid-state imaging apparatus described above.

The camera includes the solid-state imaging apparatus 1 according to the above embodiment, an optical system 2 and a signal processing circuit 3.

The optical system 2 focuses image light (incident light) from a subject onto the assembly of pixels of the solid-state imaging apparatus 1. The incident light is converted into signal charges according to the amount of the incident light in the photodiodes 30 of the solid-state imaging apparatus 1, and the signal charges are accumulated in the photodiodes 30 for a fixed period of time.

The signal processing circuit 3 provides various kinds of signal processing on the output signal from the solid-state imaging apparatus 1 and outputs the resultant signal as an image signal.

A camera with the solid-state imaging apparatus according to the above embodiment can achieve improved sensitivity.

Second Embodiment

In a second embodiment, a solid-state imaging apparatus with a four-pixel sharing structure arranged in another layout will be described.

Figure 8:
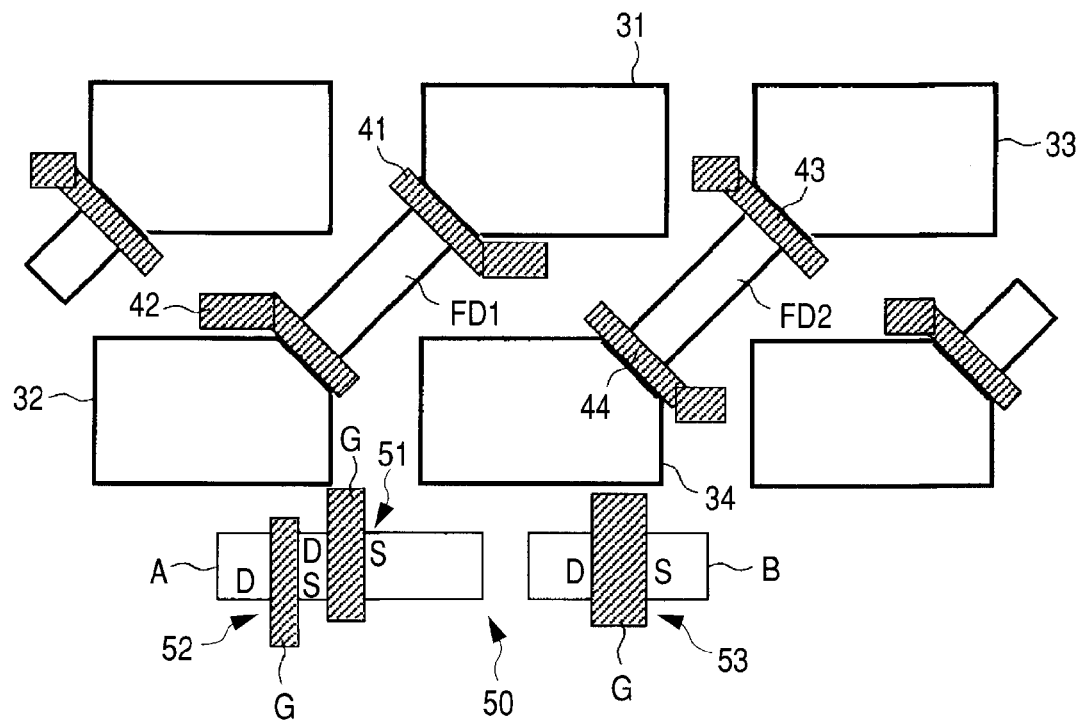
FIG. 8 shows a layout when a polysilicon electrode layer is provided in the assembly of pixels of the solid-state imaging apparatus according to the second embodiment.
Figure 9:
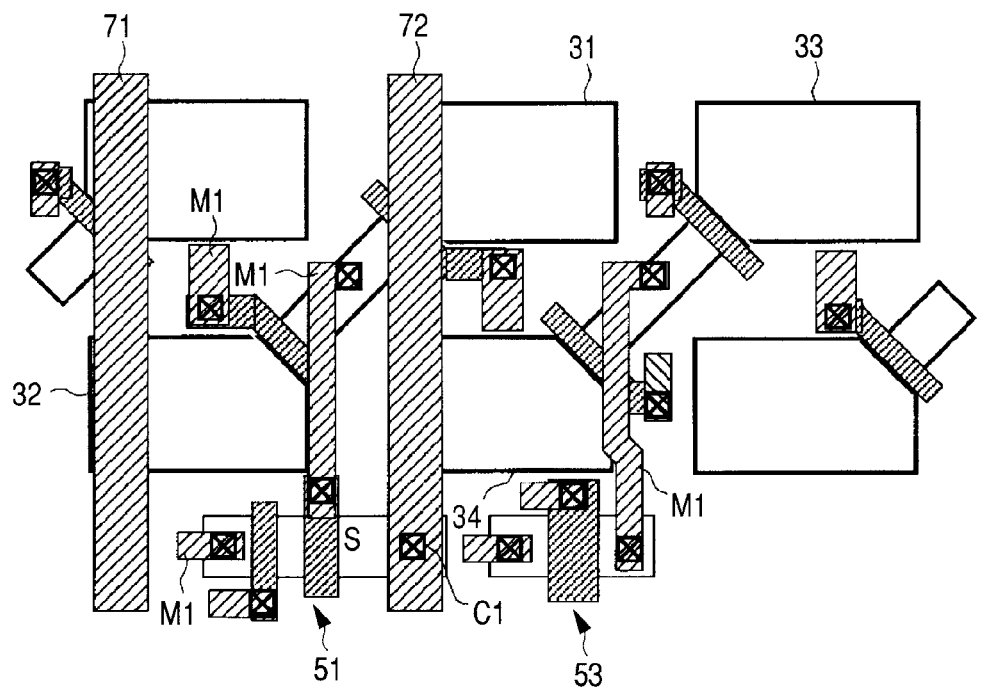
FIG. 9 shows a layout when a first metal wiring (M1) layer is provided in the assembly of pixels of the solid-state imaging apparatus according to the second embodiment.
Figure 10:
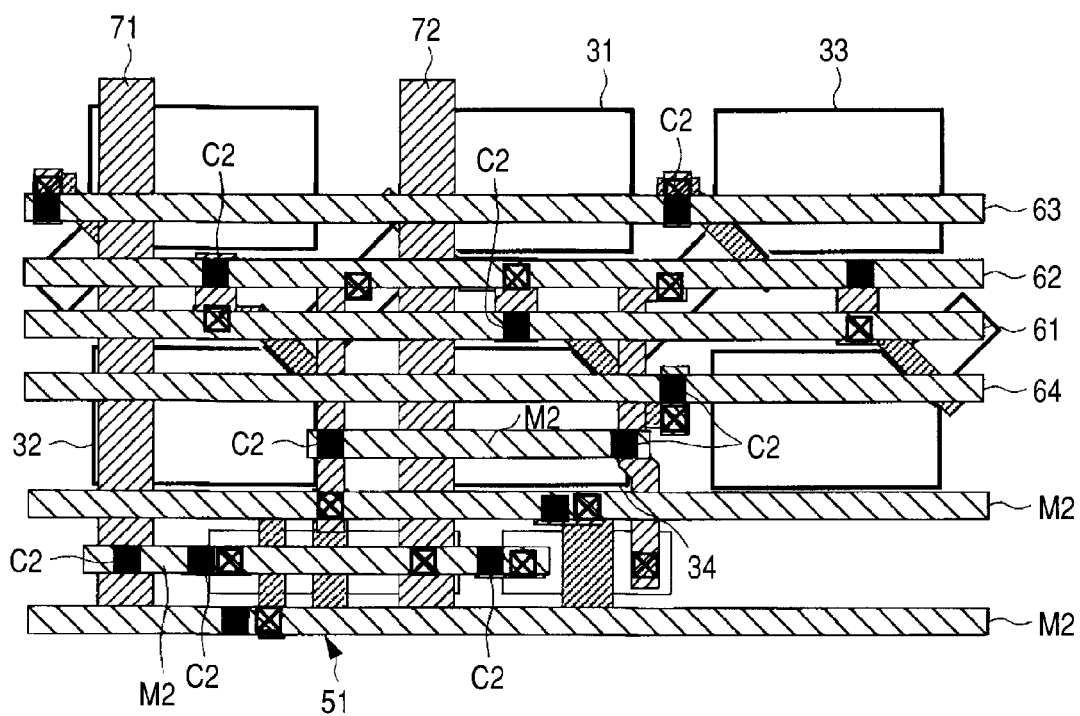
FIG. 10 shows a layout when a second metal wiring (M2) layer is provided in the assembly of pixels of the solid-state imaging apparatus according to the second embodiment.

FIGS. 8 to 10 show layouts of the assembly of pixels of the solid-state imaging apparatus according to this embodiment. FIG. 10 shows the final layout. In this embodiment, the explanation is divided using three figures for better understanding. That is, FIG. 8 shows a layout when a polysilicon electrode (gate electrode) layer is provided. FIG. 9 shows a layout when a first metal wiring layer is provided. FIG. 10 shows the final layout including a second metal wiring layer.

Description will be first made with reference to FIG. 8. The photodiodes 30 are formed in a matrix. Among the plurality of photodiodes 30, four photodiodes 31, 32, 33 and 34 arranged in the vertical and horizontal directions share one readout circuit 50.

The floating diffusion FD1 is disposed between the photodiode 31 and the photodiode 32 that is diagonally disposed with respect to the photodiode 31. The transfer gate 41 is disposed between the floating diffusion FD1 and the photodiode 31. The transfer gate 42 is disposed between the floating diffusion FD1 and the photodiode 32. The transfer gate 41 and 42 are formed of polysilicon electrodes.

The floating diffusion FD2 is disposed between the photodiode 33 and the photodiode 34 that is diagonally disposed with respect to the photodiode 33. The transfer gate 43 is disposed between the floating diffusion FD2 and the photodiode 33. The transfer gate 44 is disposed between the floating diffusion FD2 and the photodiode 34. The transfer gate 43 and 44 are formed of polysilicon electrodes.

The readout circuit 50 is disposed in a space between two photodiodes, for example, in the space between the photodiodes in the second and third rows. In this embodiment, there is one readout circuits 50 in the space where two photodiodes 32 and 34 are arranged next to each other.

The amplifier transistor 51, selection transistor 52 and reset transistor 53 that form the readout circuit 50 are disposed in an aligned manner. In this embodiment, the amplifier transistor 51 and the selection transistor 52 share one active region A. The reset transistor 53 is formed in an active region B different from the active region A. The active region A is formed adjacent to the photodiodes 32 and 34. The active region B is formed adjacent to the photodiode 34. The source of the selection transistor 52 and the drain of the amplifier transistor 51 are integrated and shared by the both transistors. The gates (G) of the amplifier transistor 51, selection transistor 52 and reset transistor 53 are formed of polysilicon electrodes.

First metal wiring lines M1 are disposed in the upper layer of the layout shown in FIG. 8 via first contacts C1 (see FIG. 9). The layout shown in FIG. 9 will now be described.

The power supply line 71 and the signal line 72 are formed of first metal wiring lines M1. The power supply line 71 and the signal line 72 extend in the column direction such that they overlap with photodiodes 30. The signal line 72 is connected to the source of the amplifier transistor 51 via the first contact C1. In this embodiment, the power supply line 71 and the signal line 72 are disposed linearly and parallel to each other. The power supply line 71 and the signal line 72 are formed such that each of them has a width wider than those of other first metal wiring lines M1.

The floating diffusion FD1 and the gate of the amplifier transistor 51 are connected to each other via first contacts C1 and the first metal wiring line M1. The first metal wiring line M1 is disposed in a region between photodiodes 30. As the floating diffusion FD1 and the gate of the amplifier transistor 51 are disposed adjacent to each other in the column direction, the first metal wiring line M1 connecting them can be short.

The floating diffusion FD2 and the source of the reset transistor 53 are connected to each other via first contacts C1 and the first metal wiring line M1. As the floating diffusion FD2 and the source of the reset transistor 53 are disposed adjacent to each other in the column direction, the first metal wiring line M1 connecting them can be short.

First metal wiring lines M1 are formed on the transfer gates 41 to 44, on the gate and drain of the selection transistor 52, and on the gate and drain of the reset transistor 53 via first contacts C1. These first metal wiring lines M1 are formed in order to make contact with second metal wiring lines M2 in the further upper layer.

Second metal wiring lines M2 are disposed in the upper layer of the layout shown in FIG. 9 via second contacts C2 (see FIG. 10). The layout shown in FIG. 10 will now be described.

The pixel selection lines 61 to 64 are formed of second metal wiring lines M2. The pixel selection lines 61 and 62 extend in the row direction in a space between photodiodes 30. The pixel selection lines 63 and 64 are disposed on the opposite sides of the pixel selection lines 62 and 61, respectively, and extend in the row direction such that they overlap with photodiodes 30.

The pixel selection line 61 is connected to the transfer gate 41 via the second contact C2. The pixel selection line 62 is connected to the transfer gate 42 via the second contact C2. The pixel selection line 63 is connected to the transfer gate 43 via the second contact C2. The pixel selection line 64 is connected to the transfer gate 44 via the second contact C2.

The second metal wiring line M2 disposed adjacent to the pixel selection line 64 connects the two first metal wiring lines M1 connected to the floating diffusion FD1 and the floating diffusion FD2. As a result, the two floating diffusions FD1, FD2, the gate of the amplifier transistor 51, and the drain of the reset transistor 53 are connected to each other.

The second metal wiring line M2 extending horizontally on the readout circuit 50 is connected to the power supply line 71, the drain of the selection transistor 52 and the drain of the reset transistor 53 via second contacts C2.

Two second metal wiring lines M2 are disposed on the opposite sides of the one second metal wiring line M2 extending on the readout circuit 50. One of the second metal wiring lines M2 connects the gates of reset transistors 53 adjacent to each other in the row direction. The other second metal wiring line M2 connects the gates of selection transistors 52 adjacent to each other in the row direction.

Advantages of the back-illuminated solid-state imaging apparatus having a multi-pixel sharing structure according to this embodiment will now be described.

In this embodiment, the amplifier transistor 51, selection transistor 52 and reset transistor 53 that form the readout circuit 50 are also disposed in the region between pixels, that is, between photodiodes in an aligned manner. The components of the readout circuit 50 are thus placed together, so that the extra space between photodiodes 30 can be reduced.

Furthermore, the second metal wiring line M2 is disposed such that it overlaps with the photodiode 32 in order to connect the floating diffusions FD1, FD2, the drain of the reset transistor 53 and the gate of the amplifier transistor 51 each other, allowing a minimized wiring distance and hence reduced resistance. In the case of the back-illuminated type, the metal wiring line thus overlapping with the photodiode 30 will not prevent light from entering the photodiode 30.

As described above, in this embodiment, the number of readout circuits 50 can be reduced by employing the multi-pixel sharing structure, and the extra space other than the photodiode 30 can be minimized by aligning the transistors that form the readout circuit 50. As a result, the area of the photodiode 30 in a pixel can be maximized. These allow increased sensitivity and an increased saturation output of the pixel and a smaller pixel while optical characteristics are maintained.

When a photodiode 30 having the same area as that of the related art is used, the area of each pixel can be reduced, so that the whole area of the assembly of pixels can be reduced. Furthermore, in this embodiment, the first metal wiring line M1 is provided such that it is not diverted around but overlaps with the photodiode 30, allowing a shorter distance for connection between the floating diffusions FD1, FD2 and the readout circuit 50. As a result, the wiring resistance can be reduced, so that the signal processing speed can be improved. Moreover, the linearly disposed pixel selection lines 61 to 64 can reduce signal degradation as compared to the case where they are disposed in a serpentine manner.

Furthermore, in the second embodiment, the power supply line 71 and the signal line 72 are disposed linearly and parallel to each other, and formed such that each of them has a width wider than those of the first metal wiring lines M1 in the same layer. These reduce voltage drop and signal degradation. Also, reduced resistance of the signal line 72 improves the signal processing speed.

Third Embodiment

In a third embodiment, a solid-state imaging apparatus with a two-pixel sharing structure will be described. The circuit configuration of the assembly of pixels 11 in the case of the two-pixel sharing structure corresponds to the circuit diagram shown in FIG. 3 except that the photodiodes 33, 34, the transfer gates 43, 44 and the pixel selection lines 63, 64 are removed.

Figure 11:
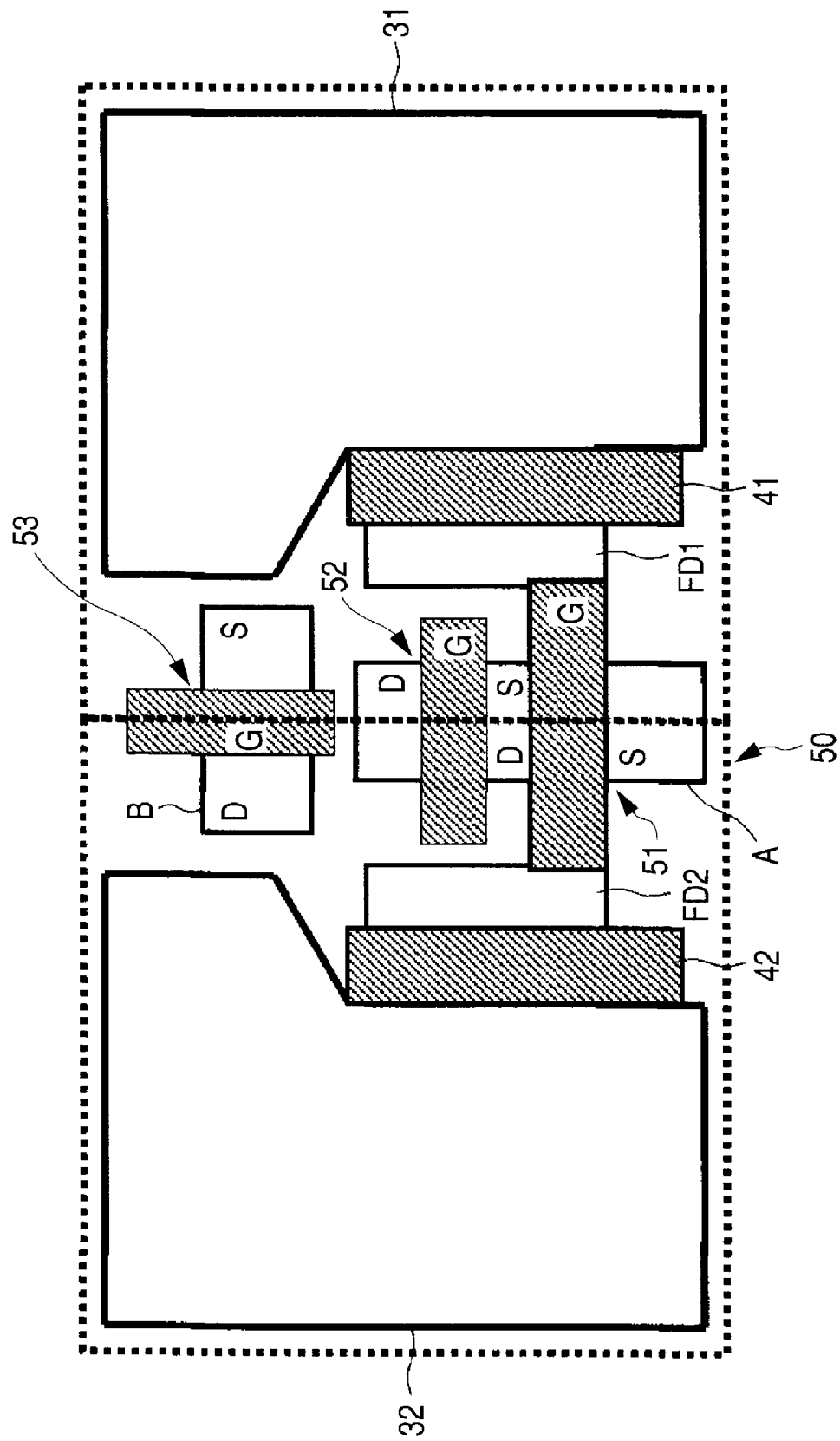
FIG. 11 shows a layout when a polysilicon electrode layer is provided in the assembly of pixels of the solid-state imaging apparatus according to the third embodiment.
Figure 12:
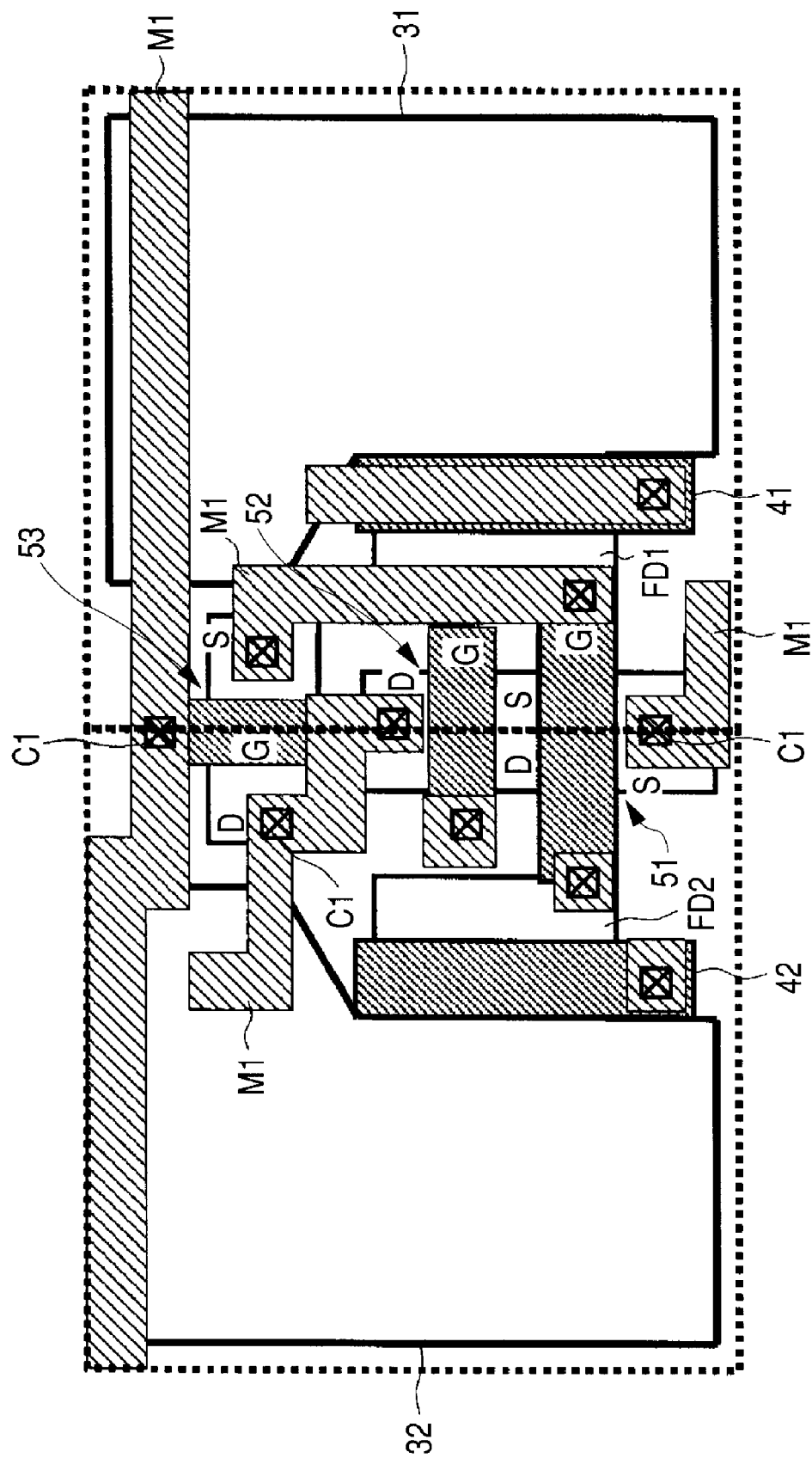
FIG. 12 shows a layout when a first metal wiring (M1) layer is provided in the assembly of pixels of the solid-state imaging apparatus according to the third embodiment.
Figure 13:
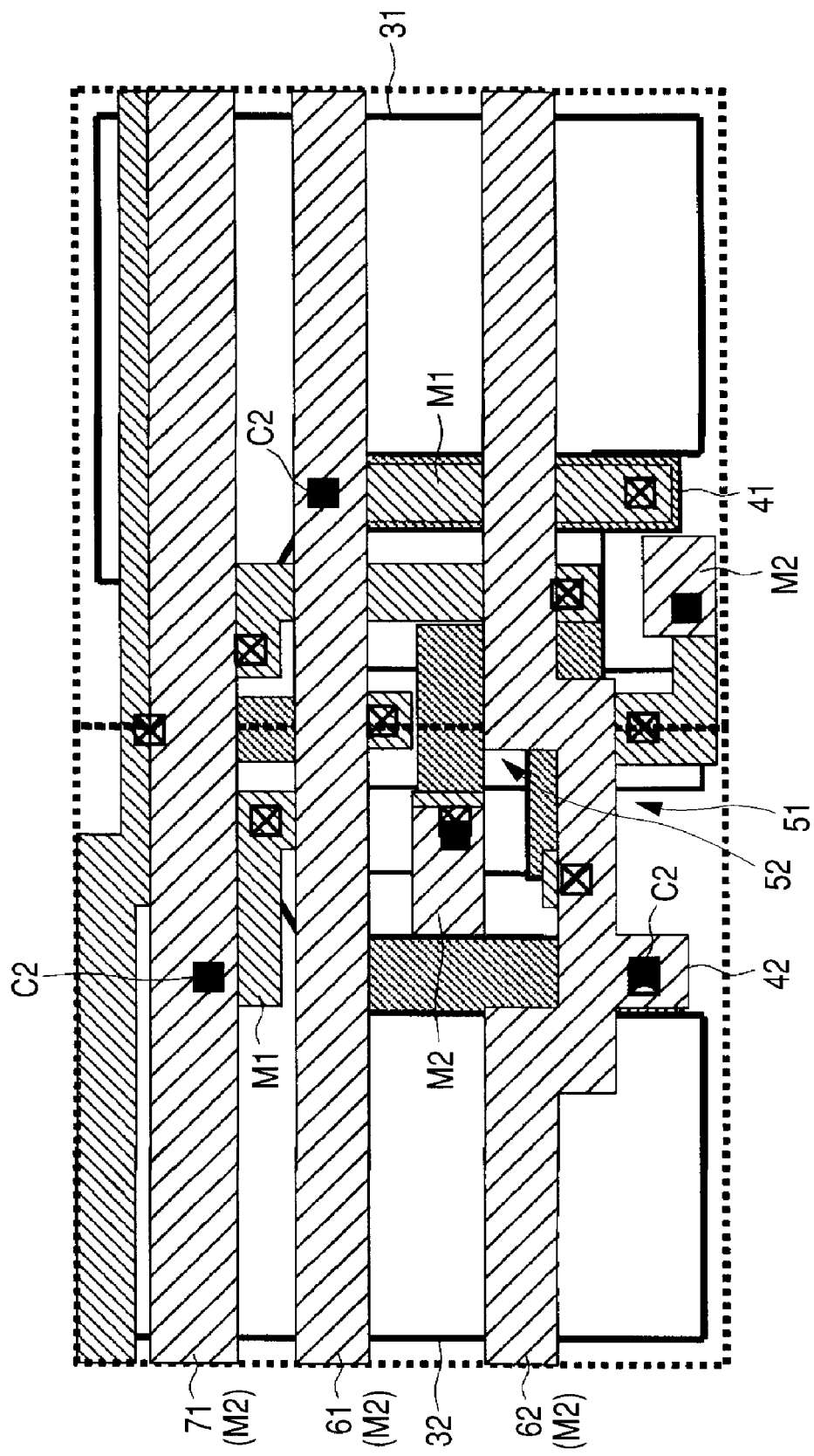
FIG. 13 shows a layout when a second metal wiring (M2) layer is provided in the assembly of pixels of the solid-state imaging apparatus according to the third embodiment.
Figure 14:
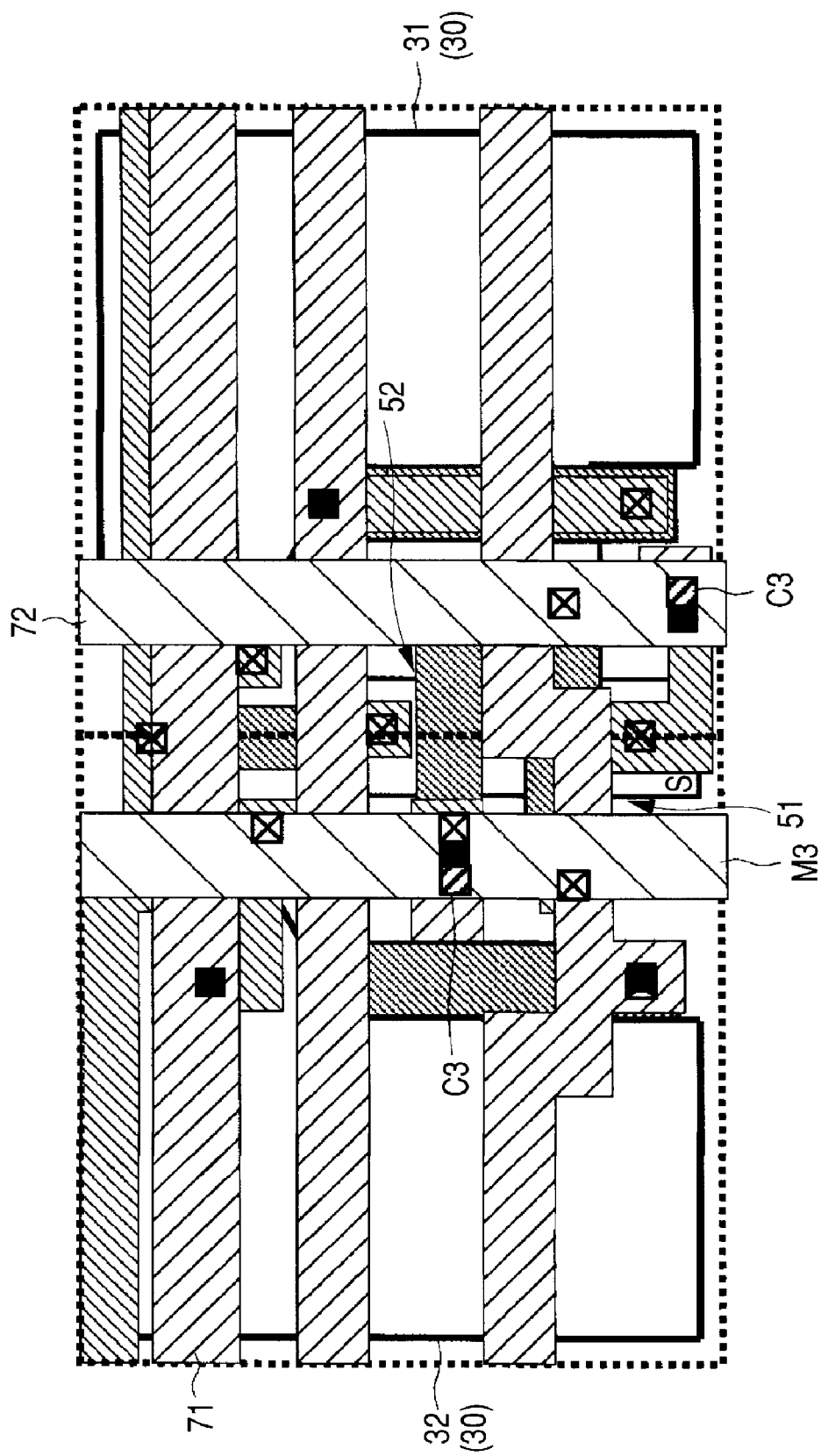
FIG. 14 shows a layout when a third metal wiring layer is provided in the assembly of pixels of the solid-state imaging apparatus according to the third embodiment.

FIGS. 11 to 14 show layouts of the assembly of pixels of the solid-state imaging apparatus according to this embodiment. FIG. 14 shows the final layout. In this embodiment, the explanation is divided using four figures for better understanding. That is, FIG. 11 shows a layout when a polysilicon electrode (gate electrode) layer is provided. FIG. 12 shows a layout when a first metal wiring layer is provided. FIG. 13 shows a layout when a second metal wiring layer is provided. FIG. 14 shows the final layout including a third metal wiring layer.

Description will be first made with reference to FIG. 11. The photodiodes 30 are formed in a matrix. Among the plurality of photodiodes 30, two photodiodes 31 and 32 arranged in the horizontal direction share one readout circuit 50.

The floating diffusions FD1 and FD2 are formed in a region between the photodiode 31 and the photodiode 32. The transfer gate 41 is disposed between the floating diffusion FD1 and the photodiode 31. The transfer gate 42 is disposed between the floating diffusion FD2 and the photodiode 32. The transfer gate 41 and 42 are formed of polysilicon electrodes.

The readout circuit 50 is disposed in a space between the two photodiodes 31 and 32. The amplifier transistor 51, selection transistor 52 and reset transistor 53 that form the readout circuit 50 are disposed in an aligned manner. In this embodiment, the amplifier transistor 51 and the selection transistor 52 share one active region A. The reset transistor 53 is formed in an active region B different from the active region A. The active region A extends in the column direction. The active region B extends in the row direction. The source of the selection transistor 52 and the drain of the amplifier transistor 51 are integrated and shared by the both transistors. The gates (G) of the amplifier transistor 51, selection transistor 52 and reset transistor 53 are formed of polysilicon electrodes.

First metal wiring lines M1 are disposed in the upper layer of the layout shown in FIG. 11 via first contacts C1 (see FIG. 12). The layout shown in FIG. 12 will now be described.

One of the first metal wiring lines M1 connects the drain of the reset transistor 53 and the drain of the selection transistor 52. Another first metal wiring line M1 connects the source of the reset transistor 53, the gate of the amplifier transistor 51 and the floating diffusion FD1. Another first metal wiring line M1 connects the floating diffusion FD2 and the gate of the amplifier transistor 51.

Another first metal wiring line M1 connects the gates of a plurality of reset transistors 53 arranged in the row direction. First metal wiring lines M1 are connected to the transfer gates 41, 42, the gate of the selection transistor 52 and the source of the amplifier transistor 51 via first contacts C1. These first metal wiring lines M1 are formed in order to make contact with second metal wiring lines M2 in the further upper layer.

Second metal wiring lines M2 are disposed in the upper layer of the layout shown in FIG. 12 via second contacts C2 (see FIG. 13). The layout shown in FIG. 13 will now be described.

The power supply line 71 and the pixel selection lines 61 and 62 are formed of second metal wiring lines M2. The power supply line 71 linearly extends in the row direction such that it overlaps with the photodiodes 31 and 32. The power supply line 71 is connected, via the second contact C2, to the first metal wiring line M1 that connects the drain of the reset transistor 53 and the drain of the selection transistor 52. The power supply line 71 is formed such that it has a width wider than those of pixel selection lines 61 and 62.

The pixel selection lines 61 and 62 extend in the row direction such that they overlap with the photodiodes 31 and 32. The pixel selection line 61 is connected, via the second contact C2, to the first metal wiring line M1 that connects to transfer gate 41. The pixel selection line 62 is connected to the transfer gate 42 via the second contact C2.

The gate of the selection transistor 52 and the source of the amplifier transistor 51 are connected to second metal wiring lines M2 via second contacts C2. These second metal wiring lines M2 are extended as necessary in order to make contact with third metal wiring lines M3 in the further upper layer.

Third metal wiring lines M3 are disposed in the upper layer of the layout shown in FIG. 13 via third contacts C3 (see FIG. 14). The layout shown in FIG. 14 will now be described.

The signal line 72 is formed of the third metal wiring line M3. The signal line 72 linearly extends in the column direction such that it overlaps with part of the photodiode 31. The signal line 72 is formed such that it has a width similar to that of the power supply line 71. The signal line 72 is connected to the source of the amplifier transistor 51 via the third contact C3.

Another third metal wiring line M3, adjacent to the signal line 72, linearly extends in the column direction. This third metal wiring line M3 is connected to the gates of a plurality of selection transistors 52 arranged in the column direction via third contacts C3.

Advantages of the back-illuminated solid-state imaging apparatus having a multi-pixel sharing structure according to this embodiment will now be described.

In this embodiment, the amplifier transistor 51, selection transistor 52 and reset transistor 53 that form the readout circuit 50 are also disposed in the region between pixels, that is, between the photodiodes 31 and 32 in an aligned manner. The components of the readout circuit 50 are thus placed together, so that the extra space between photodiodes 30 can be reduced.

Furthermore, in this embodiment, the power supply line 71 and the pixel selection lines 61, 62 extend in the row direction such that they overlap with the photodiode 30. In the case of the back-illuminated type, the metal wiring line thus overlapping with the photodiode 30 will not prevent light from entering the photodiode 30.

As described above, in this embodiment, the number of readout circuits 50 can be reduced by employing the multi-pixel sharing structure, and the extra space other than the photodiode 30 can be minimized by aligning the transistors that form the readout circuit 50. As a result, the area of the photodiode 30 in each pixel can be maximized. These allow increased sensitivity and an increased saturation output of the pixel and a smaller pixel while optical characteristics are maintained.

When a photodiode 30 having the same area as that of the related art is used, the area of each pixel can be reduced, so that the whole area of the assembly of pixels can be reduced. Furthermore, in this embodiment, the metal wiring lines M1 to M3 are provided such that they are not diverted around but overlap with photodiodes 30, allowing a shorter distance for connection. As a result, the wiring resistance can be reduced, so that the signal processing speed can be improved.

Furthermore, in the third embodiment, the power supply line 71 and the signal line 72 are linearly disposed and formed such that each of them has a width wider than those of the other metal wiring lines in the same layer. These reduce voltage drop and signal degradation. Also, reduced resistance of the signal line 72 improves the signal processing speed.

The invention is not limited to the description of the above embodiments. In the embodiments, the solid-state imaging apparatus having a two-pixel sharing structure or a four-pixel sharing structure have been described by way of example, but the invention is not limited thereto. Although the readout circuit having three transistors 51 to 53 has been described by way of example, the readout circuit may have two transistors or four or more transistors. Eliminating the selection transistor 52 results in a two-transistor based readout circuit. Various changes can be made to the wiring layout.

Various other changes can be made as long as they do not depart from the sprit of the invention.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging apparatus comprising:
   a substrate with oppositely facing first and second surfaces at respective first and second surface sides of the substrate, the substrate being of sufficient thickness to allow light incident on the first surface to pass therethrough;
   a plurality of sensors arranged in rows and columns on the second surface side of the substrate, each sensor being a pixel of the imaging apparatus and able to photoelectrically convert the light passing through the substrate into a charge signal;
   a floating diffusion on the second surface side of the substrate to which signals from two diagonally adjacent sensors are transferred, any two diagonally adjacent sensors of the plurality of sensors sharing the floating diffusion being disposed in different columns and the floating diffusion being diagonally disposed with respect to only two diagonally adjacent sensors sharing said floating diffusion;
   transfer gates on the second surface side of the substrate, and respectively disposed between the floating diffusion and the sensors; and
   a readout circuit on the second surface side of the substrate and disposed adjacent one of the sensors from which signals are transferred to the floating diffusion,
   wherein,
   the readout circuit includes a reset transistor and an amplifier transistor and the transistors are each disposed together in an active region between rows or columns of the pixels in an aligned manner, and
   the readout circuit is connected to the two diagonally adjacent sensors and to two further diagonally adjacent sensors.

2. The solid-state imaging apparatus according to claim 1, further comprising a plurality of wiring lines in the upper layer of the transistors, the wiring lines connected to the transistors and the transfer gates, wherein part of the wiring lines is disposed such that it overlaps with one of the sensor.

3. The solid-state imaging apparatus according to claim 1, wherein the reset transistor, the amplifier transistor, and a selection transistor that form the readout circuit are formed in the same active region to minimize an area of the readout circuit.

4. The solid-state imaging apparatus according to claim 3, wherein part of wiring lines that connect the floating diffusion and the reset transistor are disposed such that it overlaps with a sensor minimizing a wiring distance.

5. The solid-state imaging apparatus according to claim 1, further comprising:
   a power supply line connected to the reset transistor; and
   a signal line connected to the amplifier transistor,
   wherein,
   the power supply line and the signal line are linearly disposed such that they overlap with one of the sensors.

6. The solid-state imaging apparatus according to claim 5, wherein the power supply line and the signal line are formed such that each of them has a width wider than those of the other wiring lines in the same layer.

7. The solid-state imaging apparatus according to claim 1, further comprising a plurality of pixel selection lines that are connected to the transfer gates,
   wherein,
   the pixel selection lines are linearly disposed.

8. The solid-state imaging apparatus according to claim 1, wherein the substrate is 2 to 6 µm for visible light and 6 to 10 µm for infrared light.

9. The solid-state imaging apparatus according to claim 1, further comprising:
   a support substrate provided on the wiring layer via an adhesive layer, wherein the support substrate reinforces strength of the substrate.

10. The solid-state imaging apparatus according to claim 1, further comprising:
    a silicon oxide film formed on the first surface side of the substrate; and
    a light blocking film formed on the silicon oxide film, the light blocking film has apertures corresponding to the plurality of sensors.

11. The solid-state imaging apparatus according to claim 10, further comprising:
    a silicon nitride film formed on the silicon oxide film and the light blocking film;
    a color filter that transmits light only have a predetermined wavelength is formed on the silicon nitride film; and
    an on-chip lens that focuses incident light onto the plurality of sensors is formed on the color filter.

12. The solid-state imaging apparatus according to claim 1, wherein the plurality of sensors are four photodiodes.

13. The solid-state imaging apparatus according to claim 1, wherein the readout circuit is disposed in a space between a first set and second set of two diagonally adjacent sensors that share a first floating diffusion and a second floating diffusion, respectively.

14. The solid-state imaging apparatus according to claim 1, wherein the readout circuit is formed on the second surface side of the substrate via a gate insulating film made of silicon oxide.

15. The solid-state imaging apparatus according to claim 3, wherein a drain of the reset transistor and a drain of the selection transistor are integrated and shared.

* * * * *